July 11, 1972 J. P. MARTON 3,676,213

PROCESS FOR THE SELECTIVE FORMATION OF COATINGS BY ELECTROLESS DEPOSITION

Filed March 23, 1970

INVENTOR
John P. Marton
by McDougall, Hersh and Scott Att'ys

United States Patent Office 3,676,213

Patented July 11, 1972

3,676,213

PROCESS FOR THE SELECTIVE FORMATION OF COATINGS BY ELECTROLESS DEPOSITION

John P. Marton, London, Ontario, Canada, assignor to Welwyn Canada Limited, London, Ontario, Canada Filed Mar. 23, 1970, Ser. No. 21,661
Int. Cl. C23c 3/02
U.S. Cl. 117—212 3 Claims

ABSTRACT OF THE DISCLOSURE

A process for forming metal and alloy coatings on a dielectric substrate or support by electroless deposition wherein a portion of the substrate surface is activated so that metal will deposit on the surface when the substrate is exposed to an electroless solution containing the metal. The activated portions of the surface define a pattern corresponding to the pattern desired for the metal and alloy coating to be provided on the substrate. Areas of the surface which are adjacent to the activated portion and which are unactivated are unreceptive to the deposit of metal.

Figure 1:
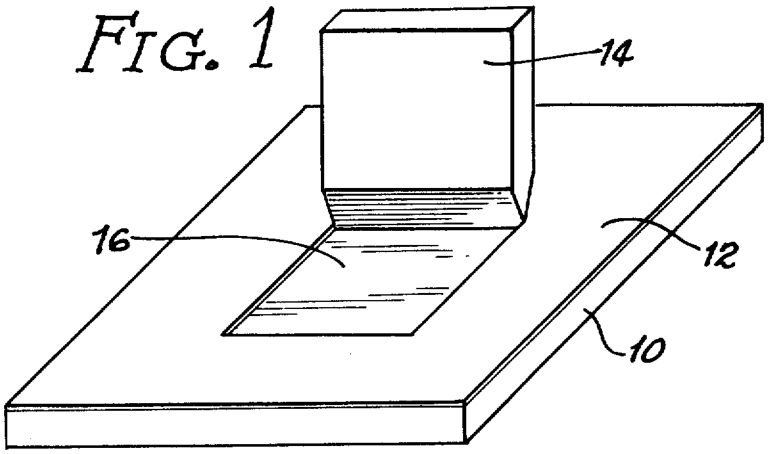

This invention relates to the selective formation of metal and alloy coatings on the surface of a solid inert dielectric support forming a substrate which may be flat, cylindrical or of any suitable geometry. The invention is particularly concerned with the selective formation of metal and alloy coatings by an electroless process.

The invention will be particularly described with reference to the production of electrical resistors; however, it will be appreciated that the concepts of the invention are applicable to the production of other devices, for example the formation of resistive networks in integrated or microcircuits, the formation of magnetic memory circuits on nonmagnetic substrates, or the formation of various other complex patterns of metals and alloys deposited on substrates of various geometry.

The basic technique of forming metal and alloy deposits by means of an electroless process are well known. Briefly, a solution containing a salt of the metal or alloy can be exposed to a catalytic surface, and a metal or alloy deposit will then form on that surface. Metals such as nickel, cobalt, copper, silver and palladium, and alloys including nickel-phosphorous, nickel-iron nickel-cobalt, nickel-tungsten, nickel-rhenium, nickel-zinc and nickel-tin may be deposited by this method on surfaces of such catalytic metals as palladium, platinum or nickel. This is accomplished without the use of electrodes and applied voltage.

Surfaces of non-catalytic metals as well as that of insulators, will not accept electroless deposits. In such cases, the surfaces can be activated and if the surfaces are then exposed to the electroless solutions, the desired deposit will occur. The activation is accomplished by treatment with solutions such as those containing tin-chloride and palladium-chloride.

Electrical resistors have been produced by forming meandered patterns in films which have been deposited on substrates by electroless techniques or by vacuum deposition. The resistors thus formed have performed satisfactorily; however, the techniques employed are not useful for producing precision resistors. For example, a meandered pattern may be formed in a deposited film by chemically etching through a mask. There are physical limitations in the production of such masks which limit track widths to about 25 micrometers. This method is also complicated and expensive and is prone to stress which develops when the photoresist mask is deposited on top of the film.

Helical patterns have been formed in films deposited on cylindrical substrates. These patterns are normally cut into the film by an abrasive wheel or a similar mechanical means. This technique is limited to the formation of track widths of 2 mm. having an edge roughness of up to 1 mm. The usable width of film is, therefore, restricted to a minimum of 2 mm. Furthermore, the mechanical cutting operation heats the film whereby the resistive value and stability may suffer.

It is a general object of this invention to provide an improved technique for the production of resistive elements as well as various electrical, magnetic, and electronic devices by means of a selective electroless process.

It is a more specific object of this invention to provide techniques for generating patterns on substrates prior to film deposition whereby the film subsequently deposited is free of the influences of masks, etching, cutting, substrate damage, heating, and other influences characterizing prior techniques.

It is a further object of this invention to provide techniques for forming tracks in elements in the type described having widths as low as 1 micrometer and being substantially free of edge roughness whereby film patterns with widths of 2 micrometers can be achieved.

It is a still further object of this invention to provide techniques which are uniquely suitable for the electroless deposition of films and which may be employed on flat and cylindrical substrates as well as on substrates of other configurations.

Figure 2:
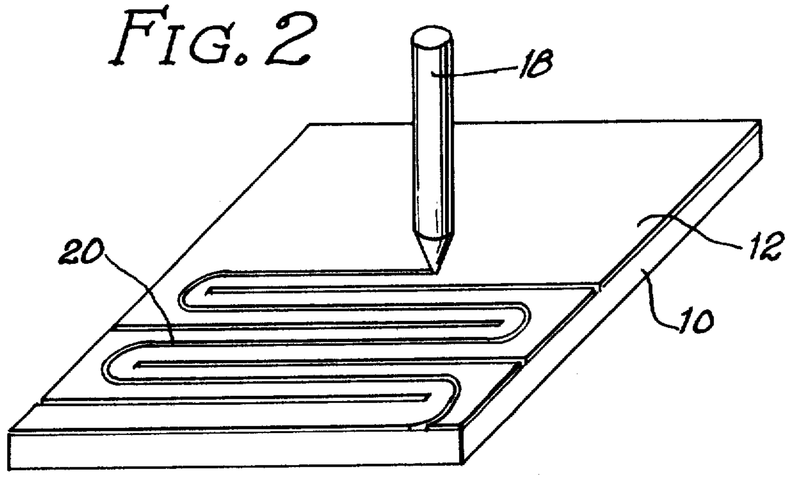

Other objects and advantages of the invention will appear hereinafter and for purposes of illustration, but not of limitation, specific embodiments of the invention are shown in the accompanying drawings in which:

FIG. 1 is a prespective view of a substrate having an activation layer formed thereon and illustrating means for partially removing the layer, thus forming a pattern in the layer; and FIG. 2 is a perspective view illustrating an alternative form of the invention.

The process of this invention generally involves the electroless deposition of a metal or alloy coating to form a predetermined pattern on a substrate. The technique involves the selective activation of a predetermined portion of the substrate surface whereby the active portions will be defined by the surface for receiving a metal or alloy deposit. When the substrate is exposed to an electroless solution which contains the metal or alloy, the metal or alloy will deposit on the substrate in accordance with the pattern defined by the active sites. The substrate is maintained in contact with the solution until the deposit of metal or alloy has proceeded to the desired thickness.

Various techniques have been devised for forming a desired pattern of active sites on a substrate. An activation layer may be selectively applied to the substrate, for example, by rendering the substrate hydrophobic in areas where the deposit is not required or by mechanically masking the areas where activation is not required.

An alternative technique involves the formation of an activation layer which covers the whole surface area of a substrate, followed by the removal of selected portions of the activation layer to form the activation layer into a desired pattern. The removal may be -performed mechanically, for example by using a stylus. Physical etching through the use of laser beams, electronic beams, spark errosion, or other means may also be employed.

The invention may also be practiced by forming an activation layer on a substrate surface, and then passivating selected portions of the layer. The passivating may be carried out by oxidizing portions of the layer corresponding to the desired pattern.

As indicated, known techniques may be employed for the activation of a passive surface. Tin-chloride and palladium-chloride solutions are used for such purposes and surface activation with such solutions involves certain major steps. The substrate is first cleaned, for example with acetone, and then immersed in a mild aqueous solution of tin-chloride at room temperature. After a water rinse, the substrate is immersed in a mild aqueous solution of palladium-chloride followed by another water rinse. An alternative method involves the use of only the palladium-chloride solution. In that case, the solution is maintained at an elevated temperature during immersion of the substrate.

The following comprise examples of various techniques incorporating the features of the invention:

EXAMPLE I

A substrate comprising a rectangular piece of glass is cleaned in vapors of isopropyl alcohol. The glass is then rendered hydrophilic by exposure to hot chromic acid. Formvar, a hydrophobic material, is then painted over a surface of the glass in a meandering pattern. The glass is then immersed for 10 seconds in an aqueous solution containing 0.1 g./l. of $SnCl_2$ and 0.1 cc./l. of HCl. The glass is rinsed for 10 seconds in water at pH=7 and then immersed for 10 seconds in an aqueous solution containing 0.1 g./l. of $PdCl_2$ and 0.1 cc./l. of HCl. The glass is again rinsed in water for 10 seconds. All solutions employed for activation are maintained at 25° C. The hydrophobic areas on the glass surface are unreceptive to activation sites. When the glass having the particular pattern of activated areas is immersed in an electroless nickel solution, nickel deposits only on the activated area. The nickel solution may comprise an aqueous solution containing 29 g./l. nickel sulphate, 17 g./l. sodium hydrophosphite, 15 g./l. sodium succinate, and 1/3 g./l. succinic acid. The electroless bath is maintained at about 50° C. during the deposition.

EXAMPLE II

A ceramic substrate is provided with a mask in the form of a thin tape, and the ceramic piece is then cleaned as in Example I. Activation of the ceramic piece is accomplished by immersing the piece for 5 minutes in an aqueous solution containing 0.1 g./l. $PdCl_2$ and 0.1 cc./l. HCl. The bath is maintained at 90° C., and the ceramic piece is rinsed in water for 10 seconds after removal from the bath. The ceramic piece is then in condition for an electroless deposit, after which the tape is removed. The metal deposit occurs only in the area which is free of the masking tape.

EXAMPLE III

A plastic rectangle 10 of the type shown in FIG. 1 is cleaned and then provided with an activation layer 12 by means of the technique described in Example I. The layer 12 is initially formed as an uninterrupted coating, and a scraping tool illustrated at 14 in FIG. 1 is then employed for removing a portion of the activation layer to expose an unactivated area 16. An electroless deposit is then formed on the plastic piece covering only the area 16.

In the arrangement of FIG. 2, the activation layer 12 on a plastic piece 10 is selectively removed by means of a stylus 18. This stylus is used for removing portions of the layer 12 to expose portions of the unactivated substrate surface, these portions defining a meandering pattern 20. When this substrate is exposed to an electroless bath, the metal deposit will form only in the exposed area. The width of pattern is controlled by the radius of the stylus, and may be made as narrow as one micrometer.

EXAMPLE IV

An activation layer, such as the layer 12 on a quartz substrate 10 is removed by means of a laser beam. The removal is accomplished by focusing the infra-red beam of a $CO_2$ laser on the substrate surface in areas where no metal or alloy deposit is required. Meandering patterns such as shown in FIG. 2 can be formed in this manner. The laser beam operates to remove active molecules from the substrate surface by evaporation. A similar result is obtained by directing an electron beam onto the surface in a vacuum chamber.

EXAMPLE V

Selective passivation of an activation layer by oxidation is carried out on a substrate of glass. The substrate is cleaned in the vapors of acetone and isopropyl alcohol, and rendered hydrophilic by treatment with hot chromic acid. Other materials such as sodium hydroxide or sulphuric acid can also be used for this purpose.

Activation of the total surface is then carried out as in Example I. The activation layer is then passivated in the areas where no metal deposition is desired by oxidation. This is accomplished by exposing the surface of the activated substrate to ultraviolet light in an oxygen atmosphere. The desired pattern is created by projecting the ultraviolet light through a photographic mask with the desired geometry. The active layer oxidizes in the presence of oxygen where ultraviolet light falls on the surface, thus rendering the active layer passive in those areas. Following the selective passivation of the active layer, the substrate is immersed in the electroless metal solution for metal deposition. Deposit occurs on the portions of the substrate where it is not exposed to ultraviolet light and on the exposed areas no metal deposition occurs. This is true regardless of the type of metal or alloy being deposited.

Materials prepared in accordance with the concepts of this invention are characterized by significantly improved properties when compared with products produced by other techniques. In the case of the manufacture of resistors, stability can be markedly improved since the edges of the pattern are free from mechanical or chemical damage and additional treatment is not required subsequent to depositing on the substrate. For example, elevated temperature stress relieving is not required since there is no stress applied during fabrication.

Resistors produced by these techniques are also characterized by very high resistive gain. For example, where a helical pattern is formed on a cylindrical substrate, or meandering patterns on a flat substrate, line widths in the order of one micrometer are obtainable. This can be accomplished without the formation of conductive discontinuities and without bridging to adjacent conductive areas. Thus, the metal or alloy deposits form in a precise fashion on the active sites. Where a stylus is used for forming a pattern in an activated layer, mechanical irregularities do not arise.

It will be understood that various changes and modifications may be made in the system of this invention which provide the characteristics of the invention.

That which is claimed is:

1. In a process for the electroless deposition of a predetermined pattern of a metal or alloy coating on an insulating substrate for forming electrical resistors and the like, the improvement comprising the steps of activating said substrate surface by forming on the surface a layer of material comprising active sites on which metal or alloy deposits will grow and adhere when the substrate is exposed to an electroless solution containing the metal or alloy, selectively removing portions of the layer to leave only a predetermined pattern of active sites on the substrate surface, the removal involving the steps of applying a stylus to said layer and moving said stylus relative to said layer whereby the stylus cuts away portions of the layer, said stylus removing material along closely spaced parallel lines over said substrate whereby an elongated, narrow length of said layer is formed on the substrate, said stylus having a point with a radius of the order of one micron whereby parallel portions of said length are closely spaced apart, the areas of said surface from which said material is removed being unreceptive to said metal or alloy, exposing said substrate to an electroless solution containing the metal or alloy and maintaining the exposure until the desired metal or alloy coating is formed in said predetermined pattern.

2. A process in accordance with claim 1 wherein said substrate defines a substantially flat surface and said stylus moves in a sinuous path during removal of said layer portions.

3. A process in accordance with claim 1 wherein said substrate is a cylindrical body and wherein said stylus moves along a helical path relative to said body during removal of the layer.

References Cited

UNITED STATES PATENTS

| | | | |
|---|---|---|---|
| 3,443,988 | 5/1969 | McCormack et al. | 117—212 |
| 3,415,679 | 12/1968 | Chuss | 117—212 X |
| 3,392,053 | 7/1968 | Olson et al. | 117—212 |
| 3,259,559 | 7/1966 | Schneble, Jr., et al. | 117—212 X |
| 3,075,855 | 1/1963 | Agens | 117—212 X |

RALPH S. KENDALL, Primary Examiner

U.S. Cl. X.R.

117—47 A, 8